United States Patent
Jang et al.

(10) Patent No.: US 11,555,867 B2
(45) Date of Patent: Jan. 17, 2023

(54) ELECTRIC POT HAVING IMPROVED RELAY INSTALLATION POSITION

(71) Applicant: LG ELECTRONICS INC., Seoul (KR)

(72) Inventors: Ho Yong Jang, Seoul (KR); Donghyun Kim, Seoul (KR); Sehwa Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 647 days.

(21) Appl. No.: 16/699,369

(22) Filed: Nov. 29, 2019

(65) Prior Publication Data

US 2020/0174086 A1 Jun. 4, 2020

(30) Foreign Application Priority Data

Nov. 30, 2018 (KR) .................. 10-2018-0153033

(51) Int. Cl.
*A47J 27/21* (2006.01)
*G01R 33/07* (2006.01)
*G01R 33/028* (2006.01)

(52) U.S. Cl.
CPC ........ *G01R 33/072* (2013.01); *A47J 27/2105* (2013.01); *A47J 27/21166* (2013.01); *G01R 33/0283* (2013.01)

(58) Field of Classification Search
CPC .... H05B 6/062; H05B 2213/05; H05B 3/746; H05B 6/1236; H05B 6/12; H05B 2213/06;

(Continued)

(56) References Cited

U.S. PATENT DOCUMENTS 4,523,083 A * 6/1985 Hamilton ............ A47J 36/2461
219/521
5,218,185 A * 6/1993 Gross ...................... H05B 6/34
219/528

(Continued)

FOREIGN PATENT DOCUMENTS

GB 2421423 6/2006
JP 2011-212376 10/2011

(Continued)

OTHER PUBLICATIONS

European Search Report dated Apr. 28, 2020 issued in EP Application No. 19211683.8.

*Primary Examiner* — Chris Q Liu
(74) *Attorney, Agent, or Firm* — Ked & Associates LLP (57) ABSTRACT

Disclosed herein is an electric pot having an improved relay installation position. The electric pot includes a pot main body that is provided with a magnetic field generator generating a magnetic field at a lower portion of the pot main body, and a supporter that includes a magnetism detection sensor detecting magnitude of a magnetic field generated by the magnetic field generator and, based on the detected magnitude of a magnetic field, generating a voltage and that includes a comparator comparing the voltage generated by the magnetism detection sensor with a predetermined reference voltage and, based on the comparison, controlling a switchover operation of a relay part, thereby controlling the relay part through a simple circuit configuration and through magnetic field generation and detection means without an additional communication means.

19 Claims, 10 Drawing Sheets

(58) Field of Classification Search
CPC ...... H05B 6/04; H05B 6/1254; H05B 1/0266;
H05B 2213/07; H05B 6/06; H05B 1/02;
H05B 6/1245; H05B 6/6417; H05B
6/666; H05B 1/0219; H05B 1/0261;
H05B 3/68; H05B 45/30; H05B 6/065;
H05B 6/1209; H05B 6/1263; H05B
11/00; H05B 6/1272; H05B 6/1281; A47J
27/2105; A47J 27/004; A47J 27/62; A47J
27/12; A47J 27/21083; A47J 31/52; A47J
37/00; A47J 27/21041; A47J 27/21066;
A47J 27/21091; A47J 27/211; A47J
27/21158; A47J 27/21166; A47J 31/047;
A47J 31/057; A47J 31/306; A47J 31/44;
A47J 31/4439; A47J 31/5253; A47J
31/56; A47J 36/26; A47J 37/0629; A47J
36/00
USPC ....... 219/665, 494, 626, 441, 492, 497, 518,
219/668, 432, 510, 627, 663, 442, 202,
219/385, 386, 433, 435, 437, 438, 446.1,
219/447.1, 448.11, 481, 482, 501, 508,
219/509, 519, 625, 660, 661, 662, 664,
219/667, 622

See application file for complete search history.

(56) References Cited

U.S. PATENT DOCUMENTS

| | | |
|---|---|---|
| 2009/0307404 A1 | 12/2009 | Payn |
| 2010/0158489 A1 | 6/2010 | Siu et al. |
| 2010/0328044 A1* | 12/2010 | Waffenschmidt ....... H02J 50/90 |
| | | 307/104 |
| 2012/0091117 A1 | 4/2012 | Cheng |
| 2013/0016462 A1* | 1/2013 | Howitt ................ A47J 27/2105 |
| | | 361/679.01 |
| 2019/0125124 A1* | 5/2019 | Nishimura .............. A47J 36/32 |

FOREIGN PATENT DOCUMENTS

| | | |
|---|---|---|
| WO | WO 2008/144805 | 12/2008 |
| WO | WO 2011/054522 | 5/2011 |

* cited by examiner

FIG. 1

Prior Art

FIG. 2

Prior Art

FIG. 3

Prior Art

FIG. 4

Prior Art

ELECTRIC POT HAVING IMPROVED RELAY INSTALLATION POSITION

CROSS-REFERENCE TO RELATED APPLICATION

This application claims priority to and the benefit of Korean Patent Application No. 10-2018-0153033, filed in Korea on Nov. 30, 2018, the disclosure of which is incorporated herein by reference in its entirety.

BACKGROUND

1. Field

The present disclosure relates to an electric pot having an improved relay installation position.

2. Background

In general, an electric pot is an apparatus that may boil fluids such as water and that may keep the fluids warm. The electric pot is also an apparatus that may boil water more readily than a gas stove. Accordingly, the pot may be used to boil water for coffee or tea. Additionally, the electric pot may be used for various purposes. For example, the electric pot may be used to cook ramyeon noodles, to heat soup, stew, and the like, to steam food, and the like.

Figure 1:
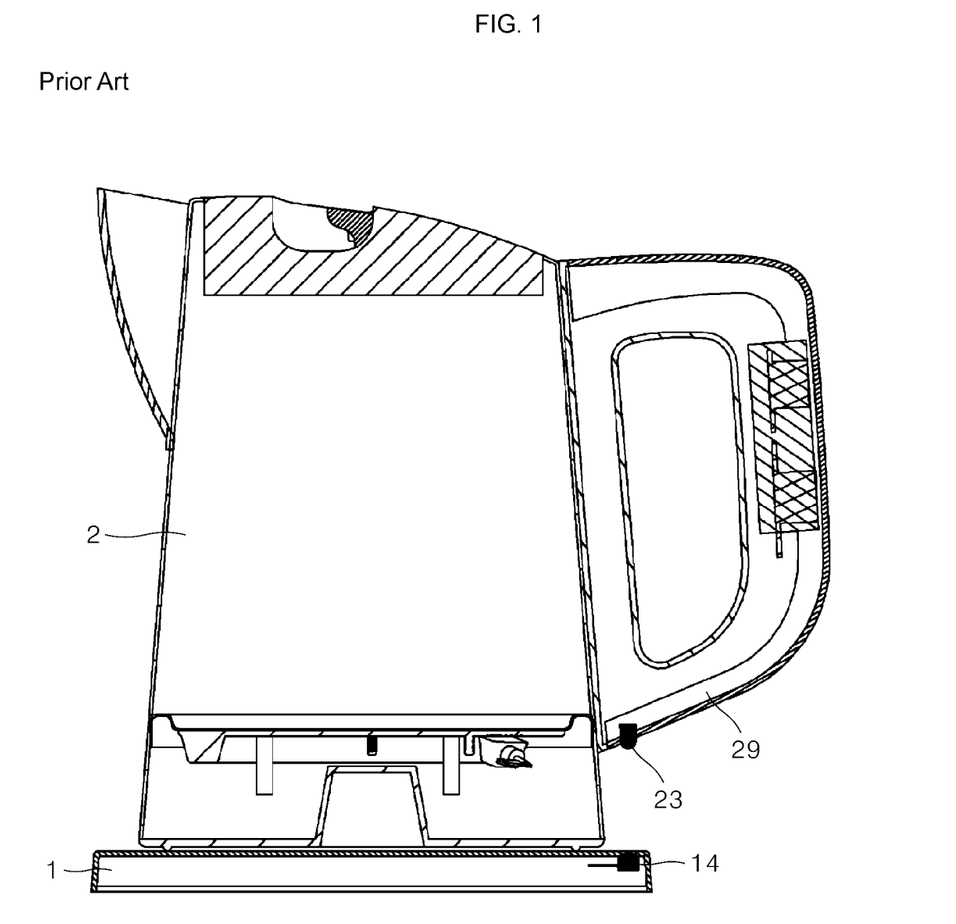
FIG. 1 is a cross-sectional view illustrating an electric pot of the related art.
Figure 2:
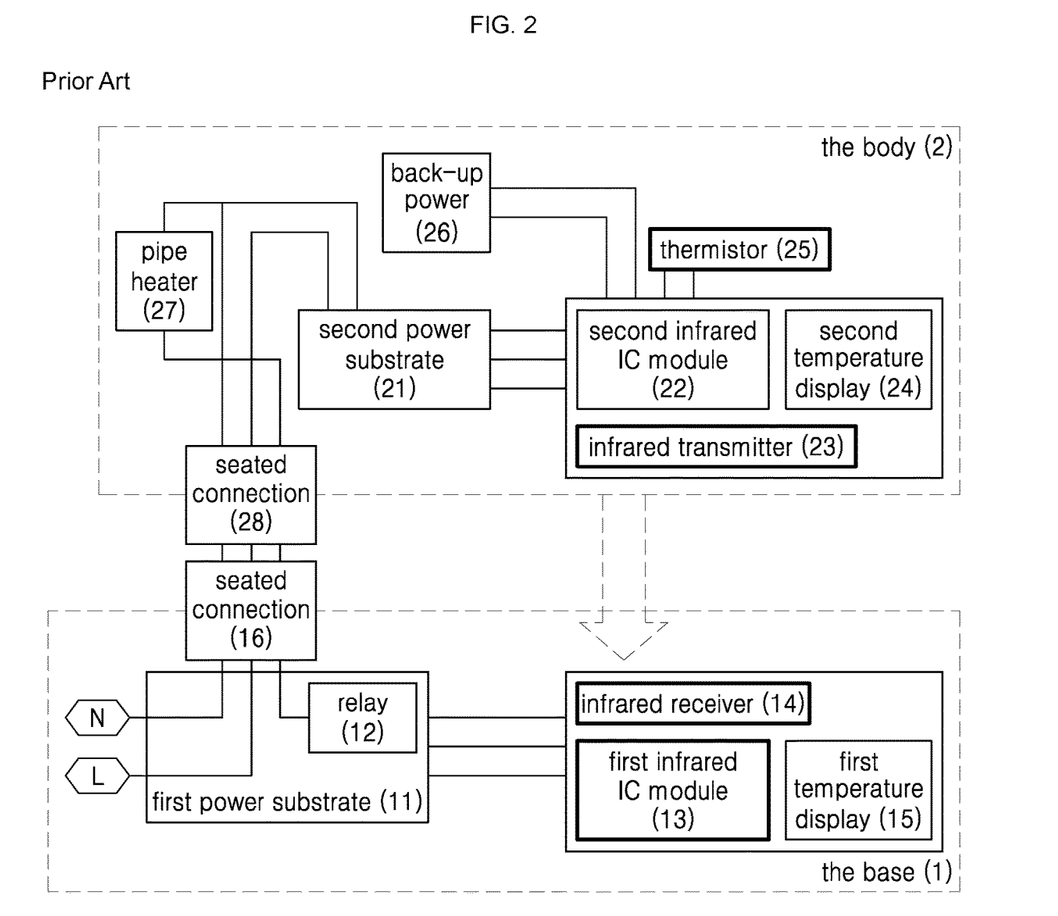
FIG. 2 is a block diagram illustrating a configuration with which the electric pot in FIG. 1 is provided.

FIGS. 1 and 2 show a configuration of an electric pot of the related art. With reference to FIGS. 1 and 2, the electric pot is described.

FIG. 1 is a cross-sectional view illustrating an electric pot of the related art, and FIG. 2 is a block diagram illustrating a configuration with which the electric pot in FIG. 1 is provided.

FIGS. 1 and 2 are drawings disclosed in U.S. Patent Publication No. 2012-0091117 A1, the subject matter of which is incorporated herein by reference. Reference numerals used in FIGS. 1 and 2 are limited only to FIGS. 1 and 2.

Referring to FIGS. 1 and 2, the electric pot of the related art includes a base 1 and a body 2 that are detachably coupled to each other. The base 1 is provided with a first power substrate 11, a relay 12, a first infrared IC module 13, an infrared receiver 14, and the like. The body 2 is provided with a second power substrate 21, a second infrared IC module 22, an infrared transmitter 23, a thermistor 25, a heater 27, and the like.

The base 1 and the body 2 are detachably coupled by a seated connection 16, 28 and are electrically connected.

In the electric pot of the related art, the relay 12 is provided in the base 1. Accordingly, in order for the relay 12 to be driven, temperature information sensed by the thermistor 25 of the body 2 is delivered to the base 1. Additionally, in order for the temperature information to be delivered with a wireless communication method, the infrared transmitter 23 is installed at a lower portion of the body 2, and the infrared receiver 14 is installed in the base 1.

When the wireless communication method is applied to an electric pot, a transmitter and a receiver, and a micom (i.e., a micro-computer) for processing communication data, and the like are installed in the base 1 and the body 2, thereby increasing manufacturing costs.

Additionally, temperature of the lower portion of the body 2 may be increased by the heater 27, and, accordingly, communication performance of the infrared transmitter 23 installed at the lower portion of the body 2 may be deteriorated.

When a foreign substance is introduced into the base 1 or the body 2, communication signals of the infrared receiver 14 and the infrared transmitter 23 may be distorted.

Figure 3:
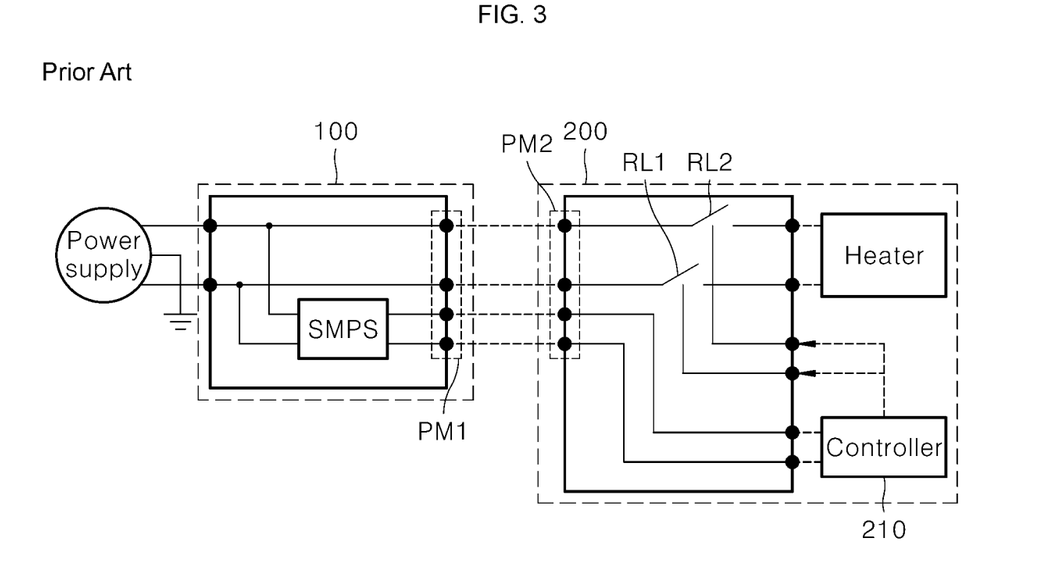
FIG. 3 is a schematic view illustrating an electric port of the related art to which a 4-terminal-type power module is applied.
Figure 4:
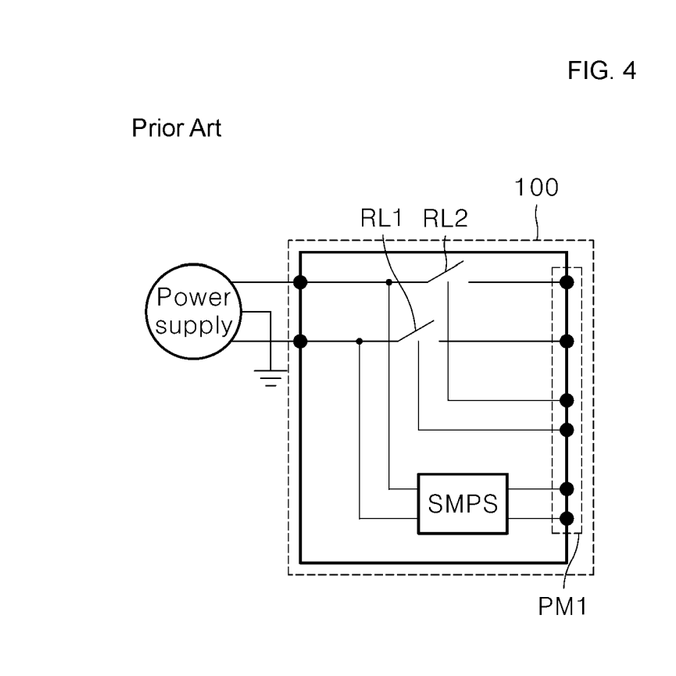
FIG. 4 is a schematic view illustrating an electric port of the related art to which a 6-terminal-type power module is applied.

FIGS. 3 and 4 show configurations of an electric pot of the related art different from the electric pot in FIG. 2. With reference to FIGS. 3 and 4, the configurations of the electric pot are described.

FIG. 3 is a schematic view illustrating an electric port of the related art to which a 4-terminal-type power module is applied, and FIG. 4 is a schematic view illustrating an electric port of the related art to which a 6-terminal-type power module is applied.

In FIG. 4, a pot main body is omitted for convenience of description.

The electric pot of the related art, as illustrated in FIG. 3, includes a supporter 100 (corresponding to the base in FIG. 1) and a pot main body 200 (corresponding to the body in FIG. 1) that are detachably coupled to each other.

Unlike the electric pot in FIG. 1, the electric pot in FIG. 3 includes the pot main body 200 in which a controller 210 and a relay (RL1, and RL2) are installed.

When the controller 210 is installed in the pot main body 200, a 4-term inal-type power module (PM1, and PM2) is used for the supporter 100 and the pot main body 200, and the relay (RL1, and RL2) is installed at a lower portion of the pot main body 200.

A user lifts the pot main body 200 (not the supporter 100) and pours boiled water into a cup or a container. Accordingly, the relay (RL1, and RL2) installed at the lower portion of the pot main body 200 of the electric pot may be damaged because the pot main body 200 is frequently moved.

When the relay (RL1, and RL2) is installed in the supporter 100 that is moved less frequently than the pot main body 200, damage to the relay (RL1, and RL2) may be minimized.

However, when the relay is to be installed in the supporter, a 6-terminal-type power module (PM1), as illustrated in FIG. 4, is applied to the supporter 100.

When the 6-terminal-type power module (PM1) is applied to the supporter 100, a product (an electric pot) has an increased diameter in itself, thereby making it difficult to satisfy a product standard.

BRIEF DESCRIPTION OF THE DRAWINGS

Embodiments will be described in detail with reference to the following drawings in which like reference numerals refer to like elements, and wherein.

DETAILED DESCRIPTION

The above-described objectives, features and advantages are specifically described with reference to the attached drawings hereunder such that one having ordinary skill in the art to which the present disclosure pertains may easily implement the technical spirit of the disclosure. In describing the disclosure, detailed description of known technologies in relation to the disclosure is omitted if it is deemed to make the gist of the present disclosure unnecessarily vague. Below, preferred embodiments of the present disclosure are specifically described with reference to the attached drawings. Throughout the drawings, identical reference numerals denote identical or similar components.

When any component is described as being "at an upper portion (or a lower portion)" of a component, or "on (or under)" a component, any component may be placed on an upper surface (a lower surface) of the component, and an additional component may be interposed between the component and any component placed on (or under) the component.

When a component is described as being "connected," "coupled" or "connected" to another component, the component may be directly connected or able to be connected to another component; however, it is also to be understood that an additional component may be "interposed" between the two components, or the two components may be "connected," "coupled" or "connected" through an additional component.

The terms "A or B", "at least one of A or/and B", or "one or more of A or/and B" as used herein include all possible combinations of items enumerated with them. For example, "A or B", "at least one of A and B", or "at least one of A or B" means (1) including at least one A, (2) including at least one B, or (3) including both at least one A and at least one B.

An exemplary electric pot is described below with reference to FIGS. 5 to 8.

Figure 5:
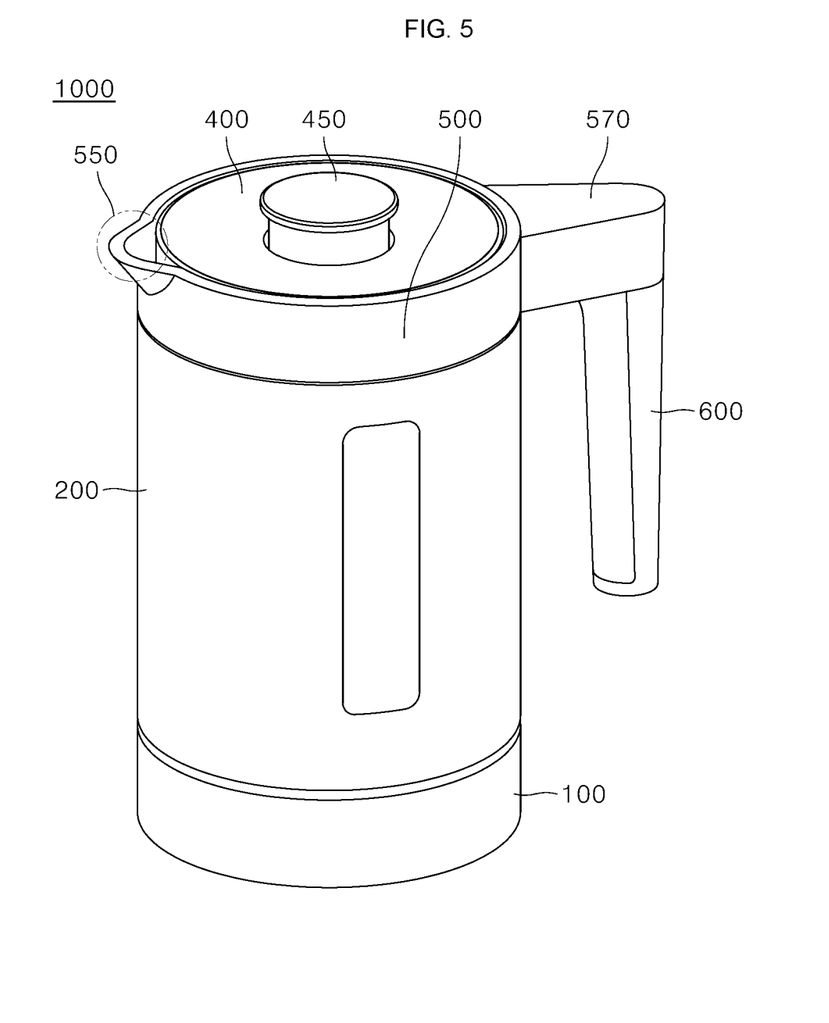
FIG. 5 is a perspective view illustrating an exemplary electric pot.
Figure 6:
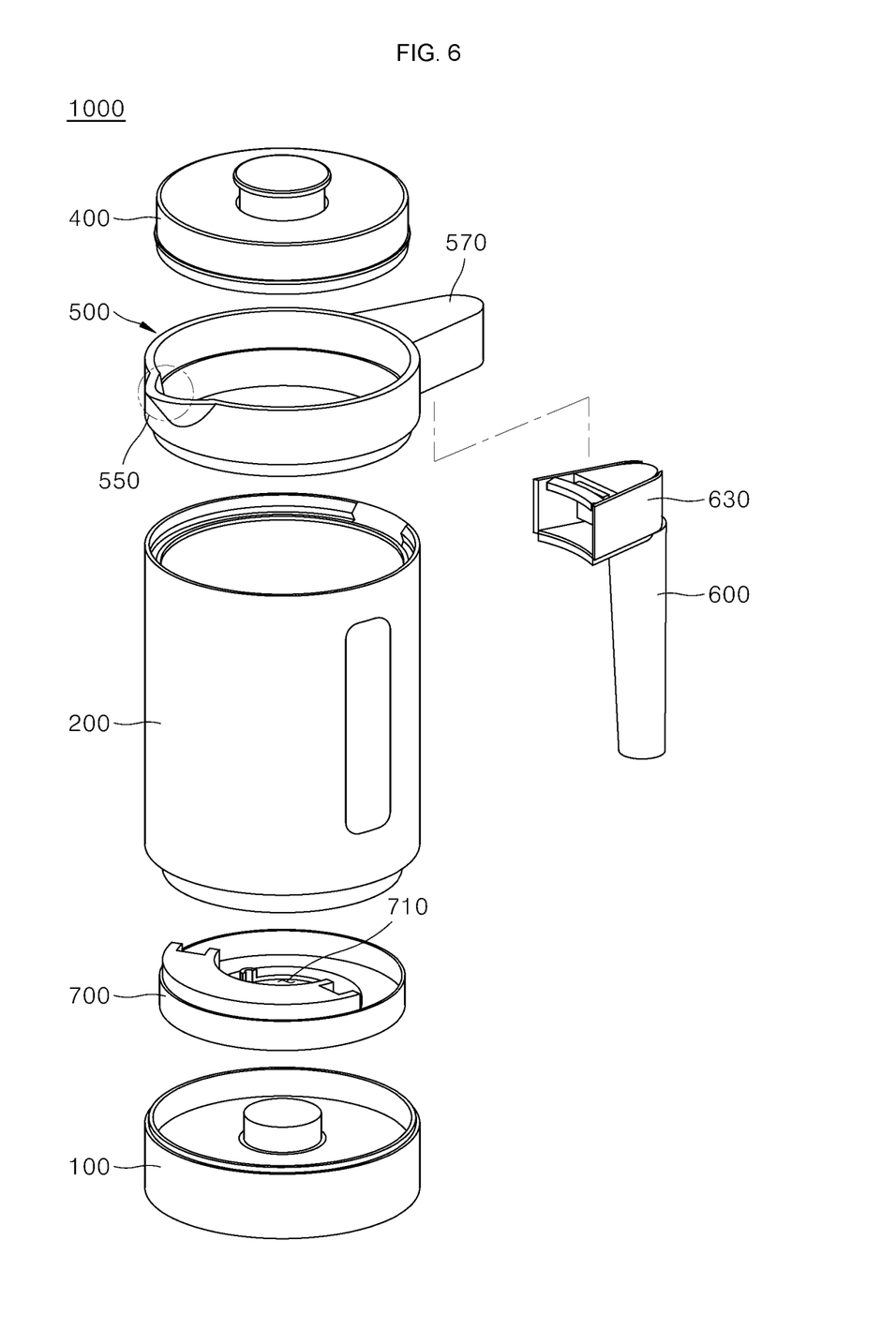
FIG. 6 is an exploded perspective view illustrating the electric pot in FIG. 5.
Figure 7:
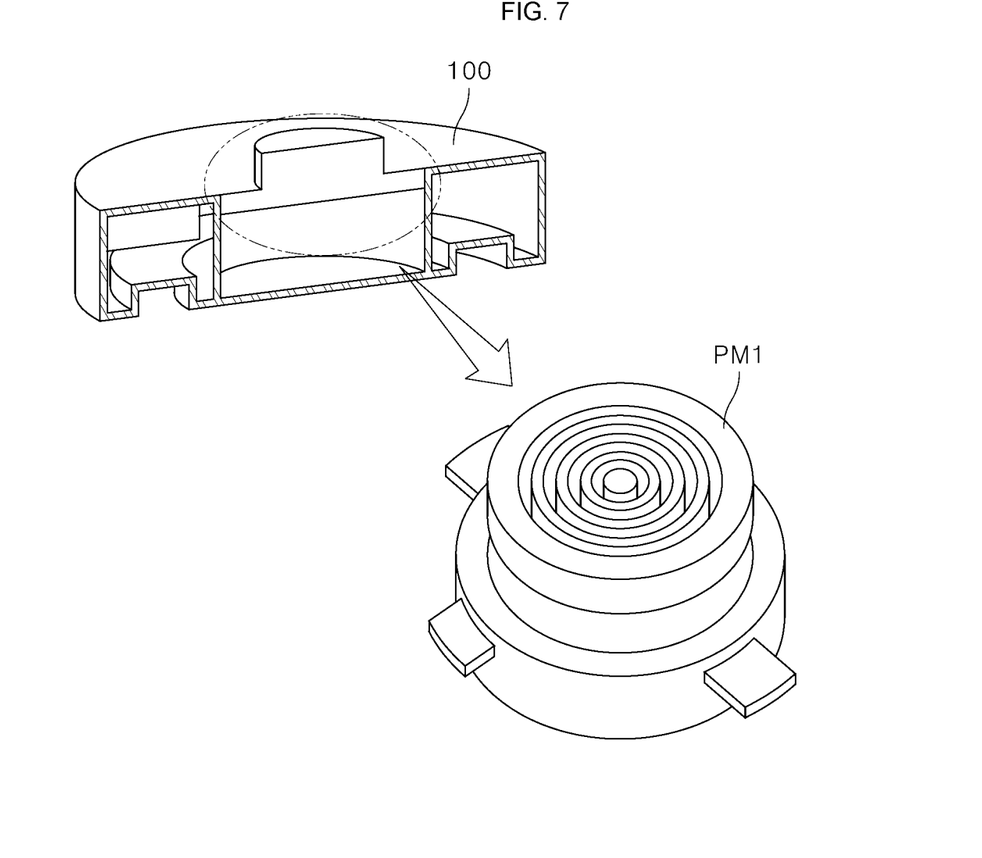
FIG. 7 is a cross-sectional view illustrating the supporter in FIG. 5.
Figure 8:
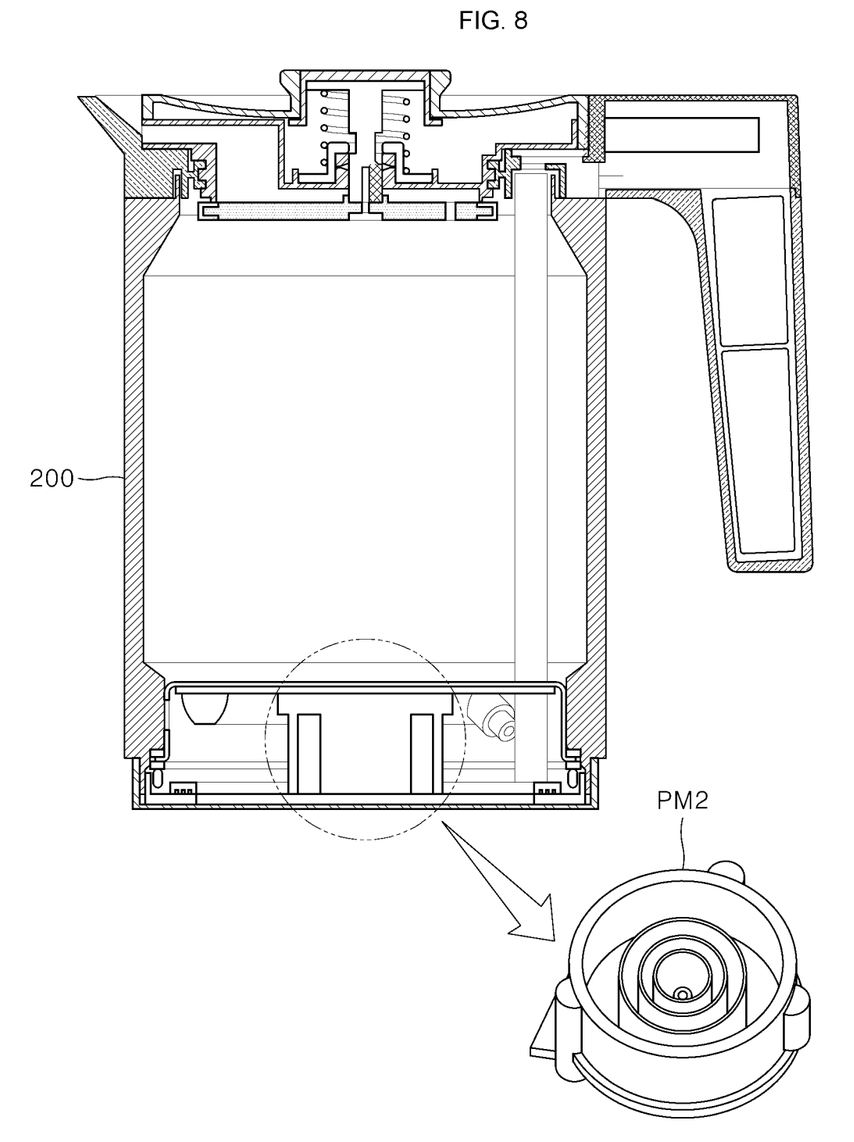
FIG. 8 is a cross-sectional view illustrating the pot main body in FIG. 5.

FIG. 5 is a perspective view illustrating an exemplary electric pot, FIG. 6 is an exploded perspective view illustrating the electric pot in FIG. 5, FIG. 7 is a cross-sectional view illustrating the supporter in FIG. 5, and FIG. 8 is a cross-sectional view illustrating the pot main body in FIG. 5. Other embodiments and configurations may also be provided.

Referring to FIGS. 5 to 8, an exemplary electric pot 1000 may include a supporter 100, a pot main body 200, a lid 400, a pot-main-body-upper-end coupler 500, a handle 600, and a pot-main-body-lower-end coupler 700. The electric pot 100 may include other components. The supporter 100 discussed with respect to FIGS. 5-10 includes different components than the supporter 100 discussed with respect to FIGS. 3-4. Additionally, the pot main body 200 discussed with respect to FIGS. 5-10 includes different components than the pot main body 200 discussed with respect to FIGS. 3-4.

First, the supporter 100 may be detachably coupled to a lower end of the pot main body 200.

Specifically, the supporter 100 may be coupled to the lower end of the pot main body 200 and may support the pot main body 200. Additionally, the supporter 100 includes a power supply cable that is connected with an external power supply (i.e., a power supply 300 in FIG. 9), and, accordingly, may receive electric power from the external power supply and may supply the electric power to the pot main body 200.

Further, as illustrated in FIG. 7, the supporter 100 is provided with a first power module (PM1) (or power device) that protrudes upwards from an upper end of the supporter 100.

Specifically, the first power module (PM1) may have a cylindrical shape that protrudes upwards from a central portion of the upper end of the supporter 100. Additionally, the first power module (PM1) is electrically connected with a second power module (PM2) through a male-female coupling with the second power module (PM2) included in the pot main body 200. Based on the electric connection of the first power module and the second power module, the supporter 100 may deliver electric power received from the external power supply to the pot main body 200. The first power module (PM1) may be male-female coupled to the second power module (PM2) and may also be electrically coupled to a heater (220 in FIG. 9) of the pot main body 200.

The pot main body 200 may be detachably coupled to the upper end of the supporter 100, and may contain contents (e.g., water, or drinks and the like) inside the pot main body 200.

Specifically, the pot main body 200 has a space that may accommodate contents (e.g., water or drinks and the like) inside the pot main body 200 and is provided with a heater (220 in FIG. 9) that heats the contents.

Additionally, the upper end of the pot main body 200 may be opened. Accordingly, the pot-main-body-upper-end coupler 500 may be coupled to the opened upper end of the pot main body 200.

A user may put contents into the pot main body 200 through the opened upper end of the pot main body 200.

Further, the pot main body 200 may include a thermal insulation material and a material that reduces heat transfer to allow contents to maintain their temperature levels. The pot main body 200 may have a cylindrical shape, but other shapes may also be provided.

Furthermore, the pot main body 200, as illustrated in FIG. 8, may be provided with the second power module (PM2), male-female coupled to the first power module (PM1), at the lower end of the pot main body 200.

The second power module (PM2) may be electrically connected with the first power module (PM1) through the male-female coupling with the first power module (PM1) included in the supporter 100. Based on the electric connection between the first power module and the second power module, the pot main body 200 may receive electric power from the supporter 100.

The pot main body 200 may include a magnetic field generator 260 (FIG. 9) at a lower portion of the pot main body 200. Detailed description in relation to this is described hereunder.

The lid 400 may be detachably coupled to an upper end of the pot-main-body-upper-end coupler 500.

Specifically, the lid 400 may be coupled to the upper end of the pot-main-body-upper-end coupler 500 and may cover the opened upper end of the pot main body 200. Additionally, the lid 400 may be coupled to the pot-main-body-upper-end coupler 500 and may allow contents contained in the pot main body 200 to be discharged only through an outlet 550 of the pot-main-body-upper-end coupler 500. The lid 400 is provided with a knob 450, protruding upwards, on an upper surface of the lid 400. Accordingly, the user may attach the lid 400 to and detach the lid 400 from the pot-main-body-upper-end coupler 500 using the knob 450.

The pot-main-body-upper-end coupler 500 may be coupled between the upper end of the pot main body 200 and the lower end of the lid 400.

Specifically, the pot-main-body-upper-end coupler 500 may be coupled between the pot main body 200 and the lid 400, and upper and lower ends of the pot-main-body-upper-end coupler 500 may all be opened. Accordingly, the user may put contents into the pot main body 200 through the pot-main-body-upper-end coupler 500 the upper and lower ends of which are opened after lifting the lid 400. Further, the pot-main-body-upper-end coupler 500 includes the outlet 550 at one side of the upper end of the pot-main-body-upper-end coupler 500. Accordingly, the contents contained in the pot main body 200 may be discharged outwards through the outlet 550 based on a degree to which the user tilts the pot main body 200, even in a state in which the lid 400 is coupled to the pot-main-body-upper-end coupler 500.

The outlet 550 may communicate with an inner space of the pot main body 200 to discharge the contents in the pot main body 200 outwards.

Additionally, the pot-main-body-upper-end coupler 500 may be provided with a handle coupler 570 on one lateral surface of the pot-main-body-upper-end coupler 500, and the handle 600 may be inserted into and coupled to the handle coupler 570.

The handle 600 may be inserted into and coupled to the handle coupler 570, and may have a pillar shape that is readily gripped in the hand of the user. Additionally, the handle 600 may be provided with a touch substrate to which a metal touch sensor (e.g., a piezo disc) is attached, and various parts and components regarding driving and controlling of the electric pot 1000, and the like at an upper portion 630 (i.e., a portion inserted into and coupled to the handle coupler 570) of the handle 600.

The pot-main-body-lower-end coupler 700 may be coupled between a lower end of the pot main body 200 and an upper end of the supporter 100.

Specifically, the pot-main-body-lower-end coupler 700 may be coupled between the pot main body 200 and the supporter 100. Additionally, the pot-main-body-lower-end coupler 700 may include an insertion hole 710 at a central portion of the pot-main-body-lower-end coupler 700, and the first power module (PM1) of the supporter 100 may be inserted into and coupled to the insertion hole 710.

The electric pot 1000 according an embodiment may have the above-described configurations and features. Other embodiments and configurations may also be provided. A relay control structure included in the electric pot in FIG. 5 may be described with reference to FIGS. 9 and 10.

Figure 9:
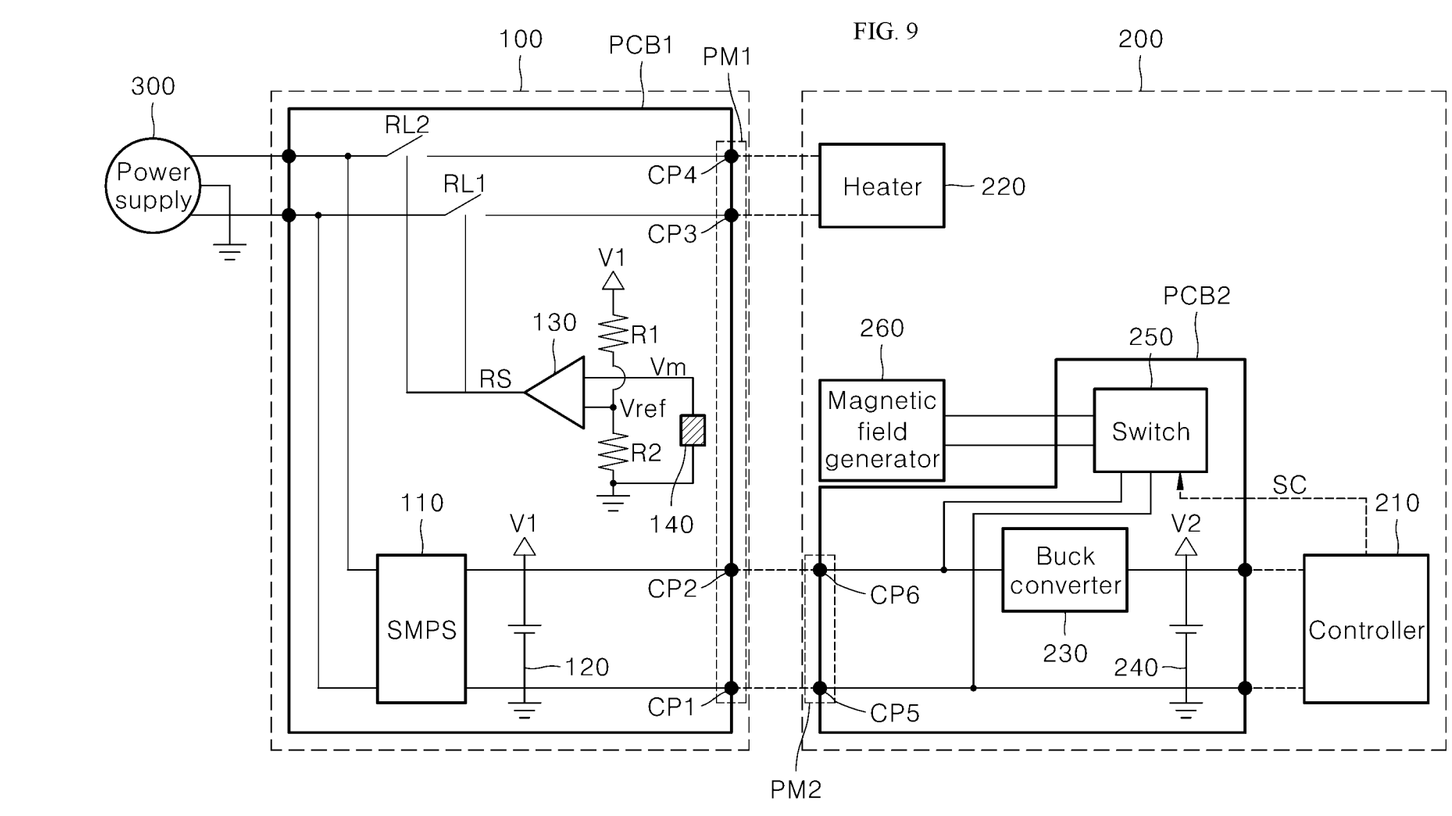
FIG. 9 is a schematic view illustrating a relay control structure of the electric pot in FIG. 5.
Figure 10:
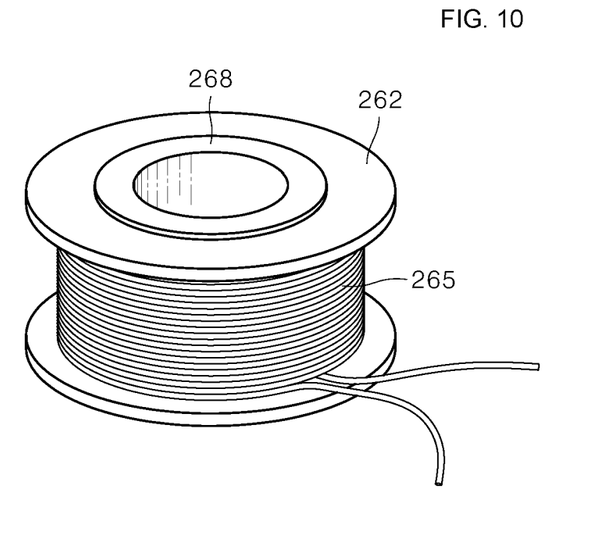
FIG. 10 is a schematic view illustrating the magnetic field generator in FIG. 9.

FIG. 9 is a schematic view illustrating a relay control structure of the electric pot in FIG. 5, and FIG. 10 is a schematic view illustrating the magnetic field generator in FIG. 9. Other embodiments and configurations may also be provided.

Referring to FIG. 9, the supporter 100 may be electrically connected with the pot main body 200 based on a male-female coupling, and the supporter 100 may deliver electric power, received from the power supply 300, to the pot main body 200.

In FIG. 9, the power supply 300 is illustrated as being outside of the supporter 100, but may be implemented in the form of a battery and the like inside the supporter 100. For convenience of description, the power supply 300 placed outside of the supporter 100 and connected with the supporter 100 through a power supply cable is provided as examples.

The supporter 100 may include a first power module (PM1), a relay part (RL1, and RL2), an SMPS 110 (a switched mode power supply), a first voltage regulator 120, a comparator 130, and a magnetism detection sensor 140. The relay part may also be referred to as a relay device. In FIG. 9, the relay device may include a first relay RL1 and a second relay RL2.

Specifically, the first power module (PM1) may be a 4-terminal-type power module including first to fourth connection terminals (CP1 to CP4), and may be male-female coupled to the second power module (PM2). When the first and second power modules (PM1, and PM2) are male-female coupled, the first and second connection terminals (CP1, and CP2) of the first power module (PM1) may be electrically connected with the second power module (PM2), and based on the electric connection, the first power module (PM1) may supply electric power to the second power module (PM2). When the first and second power modules (PM1, and PM2) are male-female coupled, the third and fourth connection terminals (CP3, and CP4) of the first power module (PM1) may be electrically coupled to the heater 220, and based on the electric coupling, the first power module (PM1) may supply electric power to the heater 220.

The relay part (RL1, and RL2) (or relay device) may include the first relay (RL1) and the second relay (RL2). The first relay (RL1) may optionally switch over a connection between the power supply 300 and the third connection terminal (CP3), and the second replay (RL2) may optionally switch over a connection between the power supply 300 and the fourth connection terminal (CP4). Additionally, the switchover operation of the relay part (RL1, and RL2) may be controlled by a comparator 130. Stated differently, the comparator 130 may control switching operations of both the first relay and the second relay. In switching operations, the first relay may electrically connect the power supply 300 and the third connection terminal CP3, or the first relay may not allow the electrical connection between the power supply 300 and the third connection terminal CP3. In switching operations, the second relay may electrically connect the power supply 300 and the fourth connection terminal CP4, or the second relay may not allow the electrical connection between the power supply 300 and the fourth connection terminal CP4. The comparator 130 may also be a selection device to control the relay device based on information received from the sensor 140.

The relay part (RL1, and RL2) may also include two or more or two or less relays. In the embodiment of the disclosure, the relay part (RL1, and RL2) including two relays is provided as an example.

The SMPS 110 may convert alternating current (AC) power received from the power supply 300 into direct current (DC) power. The SMPS 110 may also deliver (or provide) the converted direct current power to the first voltage regulator 120.

The SMPS 110, for example, may include an insulation-type SMPS but not be limited. That is, when the handle is not provided with a touch substrate, to which a metal touch sensor is attached, at the upper portion 630 (FIG. 6) of the handle, the SMPS 110 may include any one of a non-insulation-type SMPS and an insulation-type SMPS. In the embodiment of the disclosure, the SMPS 110 including an insulation-type SMPS is provided as an example for convenience of description.

The first voltage regulator 120 may control the direct current power received from the SMPS 110 to a predetermined first voltage (V1). That is, the first voltage regulator 120 may control a voltage value of the direct current power received from the SMPS 110 to a voltage value corresponding to the predetermined first voltage (V1).

The direct current power, converted by the SMPS 110 and delivered to the first voltage regulator 120, may be delivered (or provided) to the second power module (PM2) through the first power module (PM1).

The magnetism detection sensor 140 (or magnetic detection sensor) may detect magnitude of a magnetic field generated by the magnetic field generator 260, and may generate a voltage (Vm) based on the detected magnitude of the magnetic field. Additionally, the magnetism detection sensor 140 may be connected to the comparator 130.

Specifically, the magnetism detection sensor 140 may generate the voltage (Vm) based on the magnitude of the magnetic field generated by the magnetic field generator 260, and may provide information on the generated voltage (Vm) to the comparator 130.

The magnetism detection sensor 140 may include a hall sensor, for example, but not be limited.

The comparator 130 may compare the voltage (Vm) detected by the magnetism detection sensor 140 with a predetermined reference voltage (Vref), and based on results of the comparison, the comparator may control the switchover operation (or operations) of the relay part (RL1, and RL2).

More specifically, the comparator 130 may receive the information on a voltage (Vm) generated by the magnetism detection sensor 140, from the magnetism detention sensor 140, may compare the voltage (Vm) with the predetermined reference voltage (Vref), and based on results of the comparison, may control the switchover operation of the relay part (RL1, and RL2). That is, the comparator 130 may generate a relay control signal (RS) based on the results of the comparison, and may control the switchover operation of the relay part (RL1, and RL2) based on the generated relay control signal (RS).

The predetermined reference voltage (Vref) may be set as a value distributed to a second resistance (R2) among voltage values of the predetermined first voltage (V1) according to a theory of voltage distribution of first and second resistances (R1 and R2). Accordingly, a voltage value of the predetermined reference voltage (Vref) is smaller than a voltage value of the predetermined first voltage (V1).

The relay part (RL1, and RL2), the SMPS 110, the first voltage regulator 120, the comparator 130, and the magnetism detection sensor 140 may be mounted on a first printed circuit board (PCB1) provided in the supporter 100, but not be limited.

That is, the relay part (RL1, and RL2), the SMPS 110, the first voltage regulator 120, the comparator 130, and the magnetism detection sensor 140 described above may also be respectively distributed and mounted on an additional printed circuit board. In the embodiment of the disclosure, the above-described relay part (RL1, and RL2), the SMPS 110, the first voltage regulator 120, comparator 130, and the magnetism detection sensor 140 mounted on the first printed circuit board (PCB1) is provided as an example.

The pot main body 200 may be electrically connected with the supporter 100 based on a male-female coupling and may receive electric power from the supporter 100.

Additionally, the pot main body 200 may include a second power module (PM2), the heater 220, a buck converter 230, a second voltage regulator 240, a switch 250, a magnetic field generator 260, and the controller 210. At least a portion of the controller is hardware.

Specifically, the second power module (PM2) may be a 2-terminal-type power module including fifth and sixth connection terminals (CP5, and CP6), and may be male-female coupled to the first power module (PM1).

When the first and second power modules (PM1, and PM2) are male-female coupled, the heater 220 may be electrically connected with the third and fourth connection terminals (CP3, and CP4). That is, the heater 220 may be driven based on the electric power to provide heat based on the electric connection with the third and fourth connection terminals (CP3, and CP4).

The buck converter 230 may be connected to the second power module (PM2), and may convert magnitude of a voltage received from the second power module (PM2).

More specifically, when the first and second connection terminals (CP1, and CP2), and the second power module (PM2) are electrically connected, the buck converter 230 may reduce a voltage received from the first voltage regulator 120 and may deliver the reduced voltage to the second voltage regulator 240. That is, the buck converter 230 may reduce magnitude of a voltage of the direct current power received from the second power module (PM2), and may deliver the reduced voltage to the second voltage regulator 240.

One terminal (or end) of the buck converter 230 may be connected to the sixth connection terminal (CP6) and the other terminal (or end) of the buck converter 230 may be connected to the second voltage regulator 240.

The second voltage regulator 240 may control the magnitude of the voltage, converted by the buck converter 230, to a predetermined second voltage (V2). That is, the second voltage regulator 240 may control a voltage value of direct current power received from the buck converter 230 to a voltage value corresponding to the predetermined second voltage (V2).

A voltage value of the predetermined second voltage (V2) may be less than a voltage value of the predetermined first voltage (V1).

The switch 250 may optionally connect the second power module (PM2) and the magnetic field generator 260. For example, in one switch operation the switch 250 may electrically connect the second power module with the magnetic field generator 260, and in another switch operation the switch may not allow the electrical connection between the second power module and the magnetic field generator 260.

Specifically, operations of the switch 250 are controlled by the controller 210. Accordingly, the switch 250 may be turned on or turned off by a switch control signal (SC) of the controller 210.

When the switch 250 is turned on, electric power, supplied from the first power module (PM1) to the second power module (PM2), is delivered to the magnetic field generator 260, and the magnetic field generator 260 may generate a magnetic field based on the electric power received from the second power module (PM2).

When the switch 250 is turned off, power supply from the second power module (PM2) to the magnetic field generator 260 is cut off (or denied). Accordingly, the operation of generating a magnetic field performed by the magnetic field generator 260 may be stopped.

The controller 210 may be driven based on the voltage received from the second voltage regulator 240 and may control operations of the switch 250.

Specifically, when receiving a product driving signal from an input part, the controller 210 may provide a switch control signal (SC) to the switch 250 based on the received product driving signal. Additionally, when the switch 250 is turned on by the switch control signal (SC), the magnetic field generator 260 may generate a magnetic field.

When receiving a product driving stop signal from the input part, the controller 210 may provide a switch control signal (SC) to the switch 250 based on the received product driving stop signal. Additionally, when the switch 250 is turned off by the switch control signal (SC), the magnetic field generator 260 may stop generating a magnetic field.

The input part may be implemented at the above-described handle 600 (FIG. 5) or the above-described handle coupler 570 (FIG. 5) and the like in association with the above-described metal touch sensor, but not be limited. That is, the input part may be implemented on an outer surface of the pot main body 200 or the supporter 100. The controller 210 may also be provided in the handle 600 not the pot main body 200. In the embodiment of the disclosure, the input part implemented at the handle 600 (FIG. 5) or the handle coupler 570 (FIG. 5) and the like, and the controller 210 provided in the pot main body 200 are provided as an example for convenience of description.

The above-described buck converter 230, the second voltage regulator 240, and the switch 250 may be mounted on a second printed circuit board (PCB2) provided in the pot main body 200 (i.e., an inner lower portion of the pot main body 200) but not be limited.

That is, the above-described buck converter 230, the second voltage regulator 240, and the switch 250 may be respectively distributed and mounted on an additional printed circuit board. In the embodiment of the disclosure, the above-described buck converter 230, the second voltage regulator 240, and the switch 250 mounted on the second printed circuit board (PCB2) are provided as an example.

The magnetic field generator 260 may generate a magnetic field based on electric power supplied to the second power module (PM2).

Specifically, when the switch 250 is turned on, the magnetic field generator 260 may be connected to the second power module (PM2) and may receive electric power from the second power module (PM2). Further, the magnetic field generator 260 may generate a magnetic field based on the electric power received from the second power module (PM2).

When the switch 250 is turned off, a connection between the magnetic field generator 260 and the second power module (PM2) is blocked (or denied). Accordingly, the operation of generating a magnetic field performed by the magnetic field generator 260 may be stopped.

The magnetic field generator 260, as illustrated in FIG. 10, may include a bobbin 262, a coil 265 including a conducting wire that is wound multiple times around an outer circumferential surface of the bobbin 262, and a ferrite core 268 inserted into the bobbin 262.

Specifically, the coil 265 may include a conducting wire that is wound multiple times in the form of a ring. When electric currents flow through the coil 265, the coil 265 generates a magnetic field.

The coil 265 is wound multiple times around the outer circumferential surface of the bobbin 262 to entirely cover the upper surface of the supporter 100. Accordingly, a diameter of a cross section of the coil 265 may correspond to a diameter of the upper surface of the supporter 100.

The diameter of a cross section of the coil 265 may denote a diameter of the cross section in which the coil 265 wound around the bobbin 262 is cut in a direction parallel with the ground.

The bobbin 262, as illustrated in FIG. 10, may have a pillar shape such that the coil 265 is wound in the form of a ring, and may have upper and lower ends that are opened at an inner side of a central portion of the bobbin 262 such that the ferrite core 268 is inserted into the bobbin 262.

The ferrite core 268 may be inserted into the bobbin 262 and may spread a magnetic field generated by the coil 265.

The magnetic field generator 260 is provided at the lower portion of the pot main body 200. Accordingly, the magnetism detection sensor 140 may have enhanced accuracy of detecting a magnetic field.

Though not illustrated in the drawing, a plurality of magnetic field generators 260 may be provided.

For example, the magnetic field generator 260 may include two sub-magnetic field generators.

That is, the magnetic field generator 260 may includes a first bobbin, a first coil including a conducting wire that is wound multiple times around an outer circumferential surface of the first bobbin, a first sub-magnetic field generator including a first ferrite core inserted into the first bobbin, and a second bobbin different from the first bobbin, a second coil including a conducting wire that is wound multiple times around an outer circumferential surface of the second bobbin, and a second sub-magnetic field generator including a second ferrite core inserted into the second bobbin.

In this case, the first and second sub-magnetic field generators may be spaced apart from each other at the lower portion of the pot main body 200, and a diameter of a cross section of each coil may be smaller than the diameter of the above-described coil 265 because there are a plurality of coils.

The magnetic field generator 260 may include three or more sub-magnetic field generators. Description in relation to this is omitted.

The supporter 100 and the pot main body 200 may be configured as described above. A relay control method of the electric pot is described below based on the above description.

Specifically, when the controller 210 turns on the switch 250 in a state in which the first and second connection terminals (CP1, and CP2) of the first power module (PM1) and the second power module (PM2) are electrically connected, electric power supplied to the second power module (PM2) may be delivered to the magnetic field generator 260.

In this example, the magnetic field generator 260 generates a magnetic field based on electric power received from the second power module (PM2). Additionally, the magnetism detection sensor 140 detects magnitude of the magnetic field generated by the magnetic field generator 260, and generates a voltage (Vm) based on the detected magnitude of the magnetic field.

In this example, magnitude of the voltage (Vm) generated by the magnetism detection sensor 140 may be greater than magnitude of the predetermined reference voltage (Vref).

Next, when the magnitude of the voltage (Vm) generated by the magnetism detection sensor 140 is greater than the magnitude of the predetermined reference voltage (Vref), the comparator 130 may control the relay part (or relay device) to electrically connect the power supply 300 and the third and fourth connection terminals (CP3, and CP4).

In this example, electric power of the power supply 300 may be supplied to the heater 220, and, accordingly, the heater 220 may be driven to provide heat.

When the controller 210 turns off the switch 250 when the first and second connection terminals (CP1, and CP2) of the first power module (PM1) and the second power module (PM2) are electrically connected, power supply from the second power module (PM2) to the magnetic field generator 260 may be cut off (or not be allowed to be electrically connected).

In this example, the magnetic field generator 260 may stop generating a magnetic field. Accordingly, the magnetism detection sensor 140 may not detect a magnetic field or may only detect a magnetic field having magnitude much smaller than magnitude of a magnetic field that may be detected when the switch 250 is turned on. Additionally, the magnetism detection sensor 140 may generate a voltage having magnitude much smaller than magnitude of a voltage that is generated when the switch 250 is turned on.

In this example, magnitude of the voltage (Vm) generated by the magnetism detection sensor 140 may be smaller than magnitude of the predetermined reference voltage (Vref).

Next, when the magnitude of the voltage (Vm) generated by the magnetism detection sensor 140 may be smaller than the magnitude of the predetermined reference voltage (Vref), the comparator 130 may control the relay part (or relay device) block a connection (or prevent an electrical connection) between the power supply 300 and the third and fourth connection terminals (CP3, and CP4).

In this example, electric power of the power supply 300 may not be supplied to the heater 220. Accordingly, the heater 220 may not be driven.

That is, in the electric pot 1000 according to the embodiment of the present disclosure, the relay part (RL1, and RL2) may be controlled through a magnetic field detection method.

In the electric pot 1000 according to the embodiment of the disclosure, the relay part, as described above, is provided in the supporter, thereby improving a relay installation position. As a result, the possibility of damage done to the relay may be minimized. Additionally, in the electric pot 1000 according to the present disclosure, the relay part may be provided in the supporter without a 6-terminal-type power module, thereby reducing a diameter of a product and satisfying a product standard.

The electric pot 1000 according to the embodiment of the disclosure may control the relay without an additional communication means through a simple circuit configuration and through magnetic field generation and detection means, thereby reducing manufacturing costs. Further, the magnetic field generation means is strongly resistance against heat given off by the heater, and its performance is unlikely to be deteriorated by a foreign substance, thereby enhancing credibility of a product.

The present disclosure is directed to providing an electric pot having an improved relay installation position.

Additionally, the present disclosure is directed to providing an electric pot that may control a relay through a simple circuit configuration and through magnetic field generation and detection means without an additional communication means.

Objectives of the present disclosure are not limited to what has been described. Additionally, other objectives and advantages that have not been mentioned may be clearly understood from the following description and may be more clearly understood from embodiments. Further, it will be understood that the objectives and advantages of the present disclosure may be realized via means and a combination thereof that are described in the appended claims.

An electric pot according to the present disclosure includes a supporter provided with a relay part, thereby improving a relay installation position.

Additionally, the electric pot according to the present disclosure includes a pot main body that is provided with a magnetic field generator generating a magnetic field at a lower portion of the pot main body, and a supporter that includes a magnetism detection sensor detecting magnitude of a magnetic field generated by the magnetic field generator and, based on the detected magnitude of a magnetic field, generating a voltage and that includes a comparator comparing the voltage generated by the magnetism detection sensor with a predetermined reference voltage and, based on the comparison, controlling a switchover operation of a relay part, thereby controlling the relay part through a simple circuit configuration and through magnetic field generation and detection means without an additional communication means.

The electric pot may improve a relay installation position, and, as a result, may minimize the possibility of damage to a relay because a relay part is provided in a supporter. Additionally, according to the electric pot, a relay part may be provided in a supporter without a 6-terminal-type power module, thereby reducing a diameter of a product and satisfying a product standard.

Additionally, the electric pot may control a relay through a simple circuit configuration and through magnetic field generation and detection means without an additional communication means, thereby reducing manufacturing costs. Further, the magnetic field generation means is strongly resistance against heat given off by the heater, and its performance is unlikely to be deteriorated by a foreign substance, thereby enhancing credibility of a product.

Detailed effects of the present disclosure are described together with the above-described effects in the detailed description of the disclosure.

The present disclosure has been described with reference to the embodiments illustrated in the drawings. However, the disclosure is not limited to the embodiments and the drawings set forth herein. Further, various modifications may be made by one having ordinary skill in the art within the scope of the technical spirit of the disclosure. Further, though not explicitly described during description of the embodiments of the disclosure, effects and predictable effects according to the configuration of the disclosure should be included in the scope of the disclosure.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric pot, comprising:
   a supporter that includes a first power module provided at an upper end of the supporter, the first power module configured to receive electric power from a power supply, the first power module includes a first set of terminals and a second set of terminals; and
   a pot main body that includes:
      a second power module configured to receive electric power via an electric connection with the first set of terminals of the first power module,
      a heater configured to provide heat via an electric connection with the second set of terminals of the first power module, and
      a magnetic field generator to generate a magnetic field based on electric power received at the second power module, and
   wherein the supporter further includes:
      a relay device configured to perform a switchover operation that selectively switches between a connection and a non-connection between the power supply and the second set of terminals of the first power module,
      a magnetism detection sensor configured to detect magnitude of the magnetic field generated by the magnetic field generator, and the magnetism detection sensor is to provide a voltage based on the detected magnitude of the magnetic field, and
      a comparator configured to compare the voltage from the magnetism detection sensor with a predetermined reference voltage, and to control the switchover operation of the relay device based on a result of the comparison.

2. The electric pot of claim 1, wherein
   the supporter further includes:
      a switched mode power supply (SMPS) configured to receive alternating current power from the power supply and to convert the alternating current power into direct current power, and
      a first voltage regulator configured to control the direct current power from the SMPS to a predetermined first voltage, and
   the pot main body further includes:
      a buck converter connected to the second power module to receive electric power from the second power module,
      a second voltage regulator configured to control magnitude of a voltage from the buck converter to a predetermined second voltage,
      a switch configured to switch between an electrical connection and an electrical disconnection between the second power module and the magnetic field generator, and
      a controller configured to receive the voltage from the second voltage regulator and to control operations of the switch.

3. The electric pot of claim 2, wherein the magnetic field generator includes:
   a first sub-magnetic field generator that includes:
      a first bobbin,
      a first coil that includes a conducting wire wound a plurality of times around the first bobbin, and
      a first ferrite core in the first bobbin, and
   a second sub-magnetic field generator that includes:
      a second bobbin different from the first bobbin,
      a second coil that includes a conducting wire wound a plurality of times around the second bobbin, and
      a second ferrite core in the second bobbin.

4. The electric pot of claim 3, wherein the second sub-magnetic field generator is spaced apart from the first sub-magnetic field generator at a lower portion of the pot main body.

5. The electric pot of claim 3, wherein when the electric power supplied to the second power module is provided to the first and second coils, the first and second coils generate a magnetic field, and the first and second ferrite cores respectively spread the magnetic field generated by the first and second coils.

6. The electric pot of claim 2, wherein the magnetic field generator includes:
a bobbin,
a coil including a conducting wire wound a plurality of times around the bobbin, and
a ferrite core in the bobbin.

7. The electric pot of claim 6, wherein a diameter of a cross section of the coil corresponds to a diameter of an upper surface of the supporter, and the magnetic field generator is provided at a lower portion of the pot main body.

8. The electric pot of claim 6, wherein in response to the electric power received at the second power module being received at the coil, the coil is to generate a magnetic field, and the ferrite core is to spread the generated magnetic field.

9. The electric pot of claim 2, wherein in response to the controller providing a switch control signal to turn on the switch when the first set of terminals of the first power module and terminals of the second power module are electrically connected, the electric power received at the second power module is provided to the magnetic field generator, and
in response to the controller providing a switch control signal to turn off the switch when the first set of terminals of the first power module and terminals of the second power module are electrically connected, the electric power received at the second power module is not provided to the magnetic field generator.

10. The electric pot of claim 2, wherein in response to the controller providing a switch control signal to turn on the switch when the first set of terminals of the first power module and terminals of the second power module are electrically connected, the magnitude of the voltage provided by the magnetism detection sensor is greater than magnitude of the predetermined reference voltage, and
in response to the controller providing a switch control signal to turn off the switch when the first set of terminals of the first power module and the second power module are electrically connected, the magnitude of the voltage provided by the magnetism detection sensor is less than magnitude of the predetermined reference voltage.

11. The electric pot of claim 10, wherein when the magnitude of the voltage from the magnetism detection sensor is greater than magnitude of the predetermined reference voltage, the comparator is configured to control the relay device so as to electrically connect the power supply and the second set of terminals of the first power module, and
when the magnitude of the voltage from the magnetism detection sensor is less than magnitude of the predetermined reference voltage, the comparator is configured to control the relay device to avoid an electrical connection between the power supply and the second set of terminals of the first power module.

12. The electric pot of claim 2, wherein a voltage value of the predetermined first voltage is greater than a voltage value of the predetermined second voltage.

13. The electric pot of claim 2, wherein when the first set of terminals of the first power module and the second power module are electrically connected, the buck converter is to reduce the voltage received from the first voltage regulator and to provide the reduced voltage to the second voltage regulator.

14. The electric pot of claim 2, wherein the supporter includes a first printed circuit board, and the pot main body includes a second printed circuit board,
the relay device, the SMPS, the first voltage regulator, the comparator, and the magnetism detection sensor are mounted on the first printed circuit board, and
the buck converter, the second voltage regulator, and the switch are mounted on the second printed circuit board.

15. The electric pot of claim 1, wherein the first set of terminals of the first power module include first and second connection terminals, the second set of terminals of the first power module include third and fourth connection terminals, and the second power module includes fifth and sixth connection terminals to electrically connect with the first and second connection terminals, respectively.

16. The electric pot of claim 15, wherein when the first and second connection terminals are electrically connected with the fifth and sixth connection terminals, the third and fourth connection terminals are electrically connected to the heater.

17. The electric pot of claim 15, wherein the relay device includes:
a first relay that alternatively changes between a connection and a non-connection between the power supply and the third connection terminal, and
a second relay that alternatively changes between a connection and a non-connection between the power supply and the fourth connection terminal.

18. The electric pot of claim 1, wherein the magnetism detection sensor includes a hall sensor.

19. The electric pot of claim 1, wherein the first power module is provided at the upper end of the supporter to protrude upwards and is male-female coupled to the second power module, and
the supporter and the pot main body are coupled based on a male-female coupling between the first and second power modules.

* * * * *